(12) United States Patent
Kato

(10) Patent No.: US 6,836,190 B2
(45) Date of Patent: Dec. 28, 2004

(54) OSCILLATOR DEVICE AND ELECTRONIC APPARATUS USING THE SAME

(75) Inventor: Akira Kato, Takatsuki (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/077,787

(22) Filed: Feb. 20, 2002

(65) Prior Publication Data

US 2002/0135432 A1 Sep. 26, 2002

(30) Foreign Application Priority Data

Mar. 21, 2001 (JP) .......................................... 2001-081204
Jun. 5, 2001 (JP) .......................................... 2001-169954

(51) Int. Cl.[7] .............................................. H03B 5/32
(52) U.S. Cl. .............. 331/158; 331/116 R; 331/117 FC
(58) Field of Search ........................... 331/74, 117, 168, 331/100, 102, 140, 158, 116 R, 117 FC, 167

(56) References Cited

U.S. PATENT DOCUMENTS 3,973,165 A * 8/1976 Hester ......................... 315/105
5,625,327 A * 4/1997 Carroll et al. ................. 331/74
5,732,344 A * 3/1998 Rinderle et al. ............ 455/333
5,805,028 A * 9/1998 Kato ........................... 331/116
6,556,092 B1 * 4/2003 Ferrant ................. 331/116 FE
6,593,822 B2 * 7/2003 Nakano et al. ............... 331/74

\* cited by examiner

*Primary Examiner*—Tuan T. Lam
*Assistant Examiner*—Hiep Nguyen
(74) *Attorney, Agent, or Firm*—Keating & Bennett, LLP

(57) ABSTRACT

An oscillator device includes a Colpitts oscillation circuit using a bipolar transistor, which has a base that is connected to a resonator or a resonance circuit and a collector that is RF-grounded, and a buffer amplifier circuit using a grounded-base bipolar transistor or a grounded-gate FET. The emitter of the transistor in the oscillation circuit is directly connected to the emitter of the transistor in the buffer amplifier circuit or to the drain or source of the FET in the buffer amplifier circuit. The collector of the oscillation transistor is connected to a power supply. The collector of the buffer amplifier transistor, or the source or drain of the FET in the buffer amplifier circuit is DC-grounded. The buffer amplifier circuit also functions as the load of the oscillation transistor.

12 Claims, 14 Drawing Sheets

OSCILLATOR DEVICE AND ELECTRONIC APPARATUS USING THE SAME

BACKGROUND OF THE INVENTION

1. Field of the Invention

The present invention relates to an oscillator device, such as a crystal oscillator device, and an electronic apparatus, such as a cellular phone, using the oscillator device.

2. Description of the Related Art

A known piezoelectric oscillator device is disclosed in Japanese Utility Model No. 3030652.

FIG. 12 is a circuit diagram of a piezoelectric oscillator device 1 that is substantially the same as the known piezoelectric oscillator device. The oscillator device 1 includes an oscillation circuit 2 and a buffer amplifier circuit 3. The oscillation circuit 2 is a modified grounded-collector Colpitts oscillation circuit and the buffer amplifier circuit 3 is a grounded-base buffer amplifier circuit. An oscillation NPN transistor 2a in the oscillation circuit 2 and a buffer amplifier NPN transistor 3a in the buffer amplifier circuit 3 are connected in series to a power supply. A resistor 4a is connected between the emitter of the transistor 2a and ground. Also, the collector of the transistor 2a is connected to the emitter of the transistor 3a. A resistor 4b is connected between the collector of the transistor 3a and a power terminal 5. The collector of the transistor 3a is connected to an output terminal 7 via a capacitor 6. Accordingly, in the oscillator device 1, a high-frequency component output from the collector of the transistor 2a is input to the emitter of the transistor 3a, is buffer-amplified by the buffer amplifier circuit 3, and is output from the output terminal 7 via the capacitor 6.

In the oscillator device 1, a coupling capacitor is omitted between the oscillation circuit 2 and the buffer amplifier circuit 3, thus reducing the size and cost of the oscillator device.

However, the two resistors 4a and 4b are essential in the oscillator device 1 for the following reasons. Since the resistor 4a functions as an emitter resistance for a load of the oscillation circuit 2, negative resistance is not generated and the oscillation circuit 2 does not oscillate when the resistor 4a is removed. Further, since the resistor 4b functions as a resistance for a load of the buffer amplifier circuit 3, output cannot be taken from the buffer amplifier circuit 3 when the resistor 4b is removed.

Also, in the oscillator device 1, the principal current which flows from the power terminal 5 through the transistors 3a and 2a to the ground causes a voltage drop at the resistors 4b and 4a. As a result, voltages Vce which are applied between the collector and emitter of the transistor 2a, and between the collector and emitter of the transistor 3a are reduced by the voltage drop. These drops in the voltages Vce must be prevented as much as possible because they cause degradation in the amplification factor and power efficiency of the oscillator device 1. Further, many electronic apparatuses require a device which can be operated with a low-voltage power supply, and thus it is difficult to apply a sufficient voltage to the oscillator device 1.

In addition, in the oscillator device 1, the two resistors 4a and 4b consume extra power and occupy extra space, thus increasing the cost of the device.

SUMMARY OF THE INVENTION

In order to overcome the above-described problems, preferred embodiments of the present invention provide an oscillator device having fewer electronic components and an electronic apparatus including such a novel oscillator device.

Preferred embodiments of the present invention provide an oscillator device which operates with high efficiency at a low power supply voltage and an electronic apparatus including such a oscillator device.

In the oscillator device according to a preferred embodiment of the present invention, the emitter of an oscillation transistor in an oscillation circuit is directly connected to the emitter of a buffer amplifier transistor in a buffer amplifier circuit or to the source or drain of an FET. The buffer amplifier circuit functions as a load connected to the emitter of the oscillation transistor in the oscillation circuit. Accordingly, a load resistor is not required.

With this unique arrangement, the oscillator device of preferred embodiments of the present invention operates with high efficiency at a low power supply voltage. Further, reduced power consumption, high performance, low cost, and miniaturization are achieved.

Other features, characteristics, elements and advantages of the present invention will become apparent from the following description of preferred embodiments thereof with reference to the attached drawings.

DETAILED DESCRIPTION OF PREFERRED EMBODIMENTS

Figure 1:
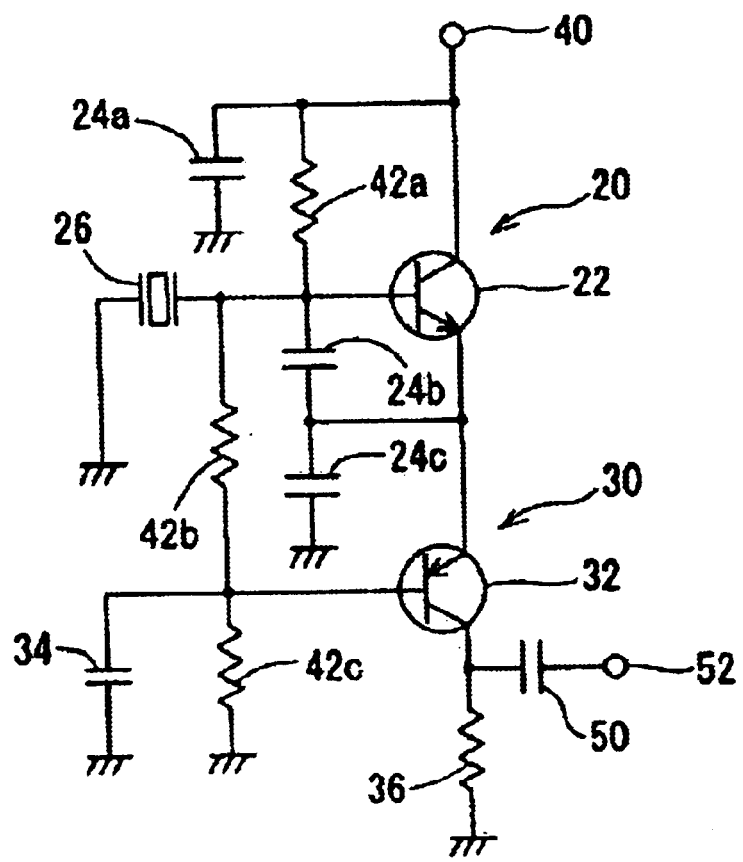
FIG. 1 is a circuit diagram showing a preferred embodiment of an oscillator device according to the present invention.

FIG. 1 is a circuit diagram showing a preferred embodiment of an oscillator device according to the present invention. The oscillator device 10 shown in FIG. 1 includes a grounded-collector Colpitts oscillation circuit 20 and a grounded-base buffer amplifier circuit 30.

The oscillation circuit 20 includes an oscillation transistor 22. As the transistor 22, an NPN transistor is preferably used. The collector of the transistor 22 is grounded via a capacitor 24a. The capacitor 24a is used in the grounded-collector oscillation circuit to prevent leakage of high-frequency signals from the collector of the transistor 22 to the power supply. A capacitor 24b is connected between the base and emitter of the transistor 22. A capacitor 24c is connected between the emitter of the transistor 22 and ground. The capacitors 24b and 24c are used to set a feedback ratio for the Colpitts oscillation circuit.

A crystal oscillator 26 is connected between the base of the transistor 22 and ground. The crystal oscillator 26 is used to make the oscillation circuit 20 a crystal oscillation circuit.

The emitter of the transistor 22 is connected to the emitter of a buffer amplifier transistor 32 of the buffer amplifier circuit 30. Accordingly, the buffer amplifier circuit 30 also functions as a load connected to the emitter of the transistor 22. Also, the collector of the transistor 22 is connected to a power terminal 40, to which a positive-polarity power supply (not shown) is connected.

As the transistor 32, a PNP transistor is preferably used. The base of the transistor 32 is grounded via a capacitor 34. The capacitor 34 is used in the grounded-base buffer amplifier circuit. A resistor 36 is connected between the collector of the transistor 32 and ground. The resistor 36 functions as a load of the buffer amplifier circuit 30.

A resistor 42a is connected between the power terminal 40 and the base of the transistor 22. A resistor 42b is connected between the base of the transistor 22 and the base of the transistor 32. Further, a resistor 42c is connected between the base of the transistor 22 and ground. These resistors 42a to 42c apply individual bias voltages to the base of the transistor 22 and the base of the transistor 32.

The collector of the transistor 32 is connected to an output terminal 52 via a coupling capacitor 50.

In the oscillator device 10, a high-frequency component output from the emitter of the transistor 22 is input to the emitter of the transistor 32, is buffer-amplified in the buffer amplifier circuit 30, and is output from the output terminal 52 via the capacitor 50.

Figure 12:
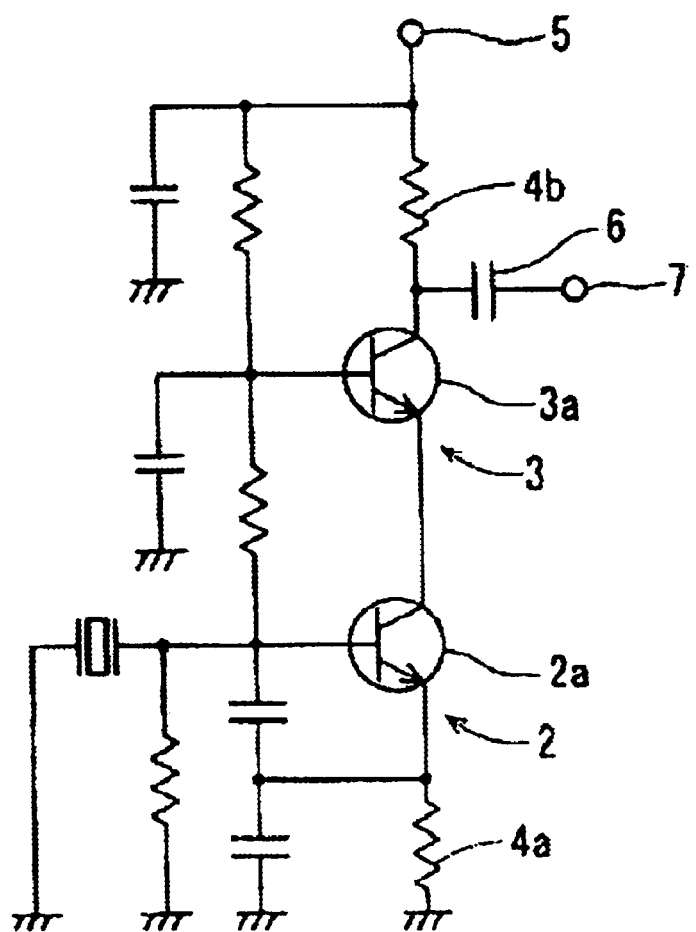
FIG. 12 is a circuit diagram showing an example of a known oscillator device.

In the oscillator device 10, since the buffer amplifier circuit 30 also functions as the load of the oscillation circuit 20, a resistor that functions as the load connected to the oscillation circuit is not required. As a result, the number of resistors in the current path between the power supply and its ground is reduced by 1. Therefore, in the oscillator device 10, the usage efficiency of the power supply is greatly improved, the power consumption is significantly reduced, the size oscillator device is miniaturized because of the reduction in the space required for providing resistors on a circuit board, and the cost is greatly reduced, as compared with the oscillator device 1 shown in FIG. 12.

Further, in the oscillator device 10, the transistor 22 and the transistor 32 are connected in series to the power supply. In this configuration, the emitter of the transistor 22 is connected to the emitter of the transistor 32 and an oscillation output is taken from the emitter of the transistor 22. Accordingly, the oscillation circuit 20 is very strongly coupled to the buffer amplifier circuit 30 and design freedom is greatly improved.

Also, in the oscillator device 10, the spectral purity of a high-frequency oscillation signal is greatly increased because bipolar transistors, such as NPN transistors or PNP transistors, are used since they cause less flicker noise than field-effect transistors (FET). That is, the oscillator device 10 causes less phase noise as compared to an oscillator device using an FET, and thus is preferable for use as a crystal oscillator device, especially a temperature-compensated crystal oscillator device.

In the oscillator device 10, a PNP transistor having a low cutoff frequency is used as the buffer amplifier transistor 32. However, this does not cause any problems because the gain of a buffer amplifier transistor generally does not have to be high.

Figure 2:
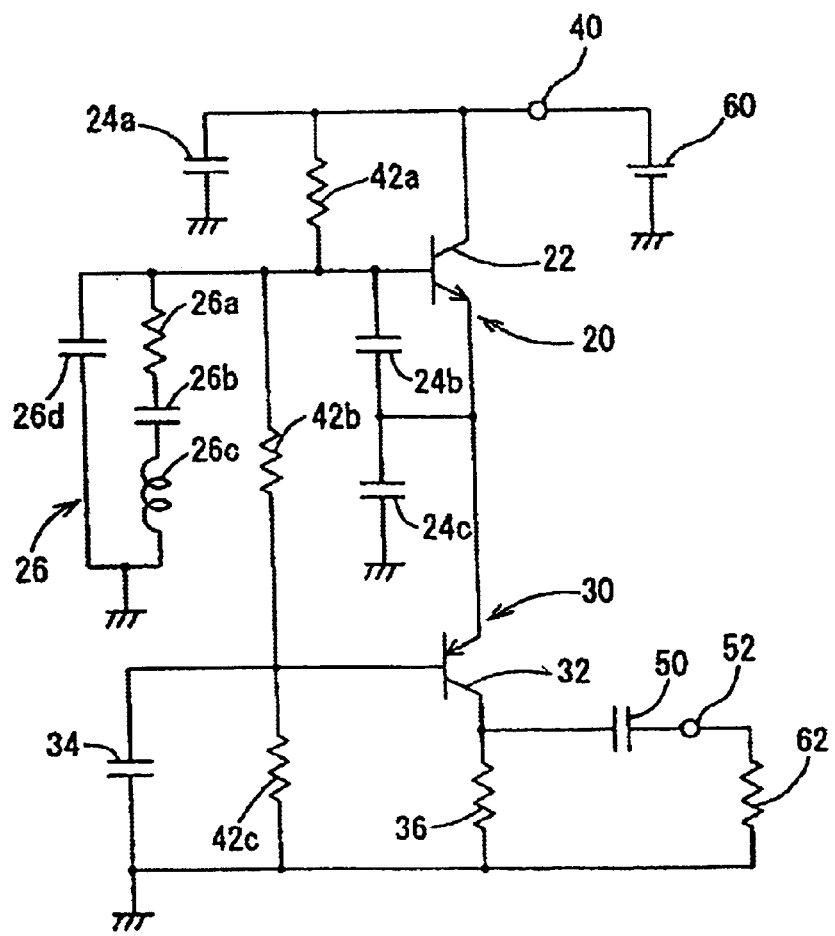
FIG. 2 is an equivalent circuit of the oscillator device shown in FIG. 1.

FIG. 2 shows an example of an equivalent circuit of the oscillator device shown in FIG. 1. In FIG. 2, the piezoelectric oscillator 26 is defined by a circuit in which a capacitor 26d is connected in parallel to a series circuit including a resistor 26a, a capacitor 26b, and an inductor 26c. A 9-volt power supply 60 is connected to the power terminal 40 and a resistor 62 that functions as a load is connected between the output terminal 52 and the ground.

Figure 3:
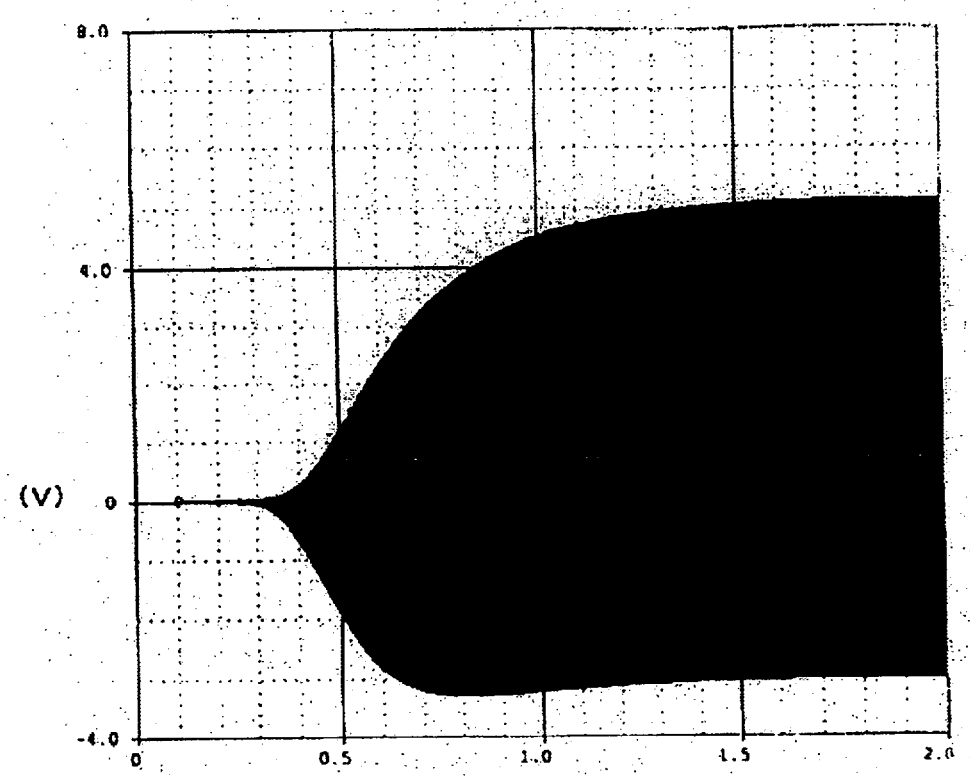
FIG. 3 is a graph showing the result of a circuit simulation of the oscillator device shown in FIG. 2.

FIG. 3 is a graph showing the result obtained by performing circuit analysis of an example of the oscillator device 10 shown in FIG. 2 by a computer using known software. In the example of oscillator device 10 shown in FIG. 2, a 2SC4561 transistor is used as the transistor 22. Additionally, a 10000 pF capacitor, a 500 pF capacitor, and a 200 pF capacitor are used as the capacitors 24a, 24b, and 24c, respectively. Further, the piezoelectric oscillator 26 is defined by a circuit having a series circuit including a resistor 26a of 10 $\Omega$, a capacitor 26b of 0.49 pF, and an inductor 26c of 0.03148 H, and a capacitor 26d of 20 pF connected in parallel to the series circuit. A 2SA1747 transistor is used as the transistor 32. A 2000 pF capacitor and a 10 pF capacitor are used as the capacitors 34 and 50, respectively. Further, a 1000 $\Omega$ resistor, a 5 k$\Omega$ resistor, a 10 k$\Omega$ resistor, a 10 k$\Omega$ resistor, and a 100 k$\Omega$ resistor are used as the resistors 36, 42a, 42b, 42c, and 62, respectively.

As is apparent from the graph shown in FIG. 3, the oscillator device 10 shown in FIG. 2 operates very efficiently.

Figure 4:
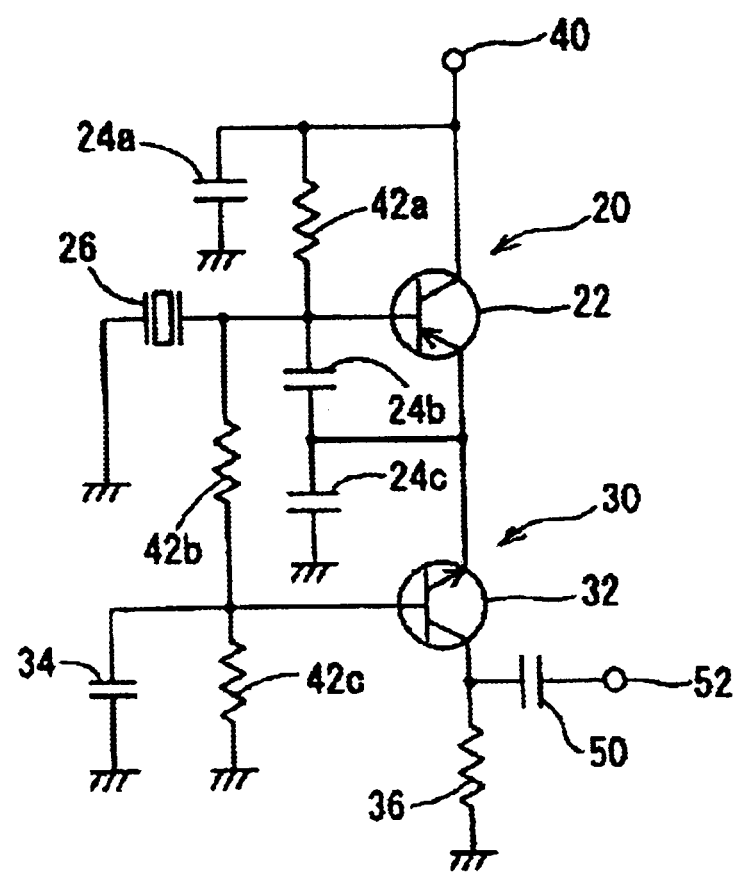
FIG. 4 is a circuit diagram showing another preferred embodiment of the oscillator device according to the present invention.

FIG. 4 is a circuit diagram showing another preferred embodiment of the oscillator device according to the present invention. The oscillator device 10 shown in FIG. 4 differs from the one shown in FIG. 1 in that a PNP transistor is used as the transistor 22 and an NPN transistor is used as the transistor 32. Further, a negative-polarity power supply (not shown) is connected to the power terminal 40. Accordingly, in the oscillator device 10 shown in FIG. 4, the current direction is opposite to that in the oscillator device 10 shown in FIG. 1, but the operation is the same. Therefore, the oscillator device 10 shown in FIG. 4 achieves the same advantages as those of the oscillator device 10 shown in FIG. 1.

Figure 5:
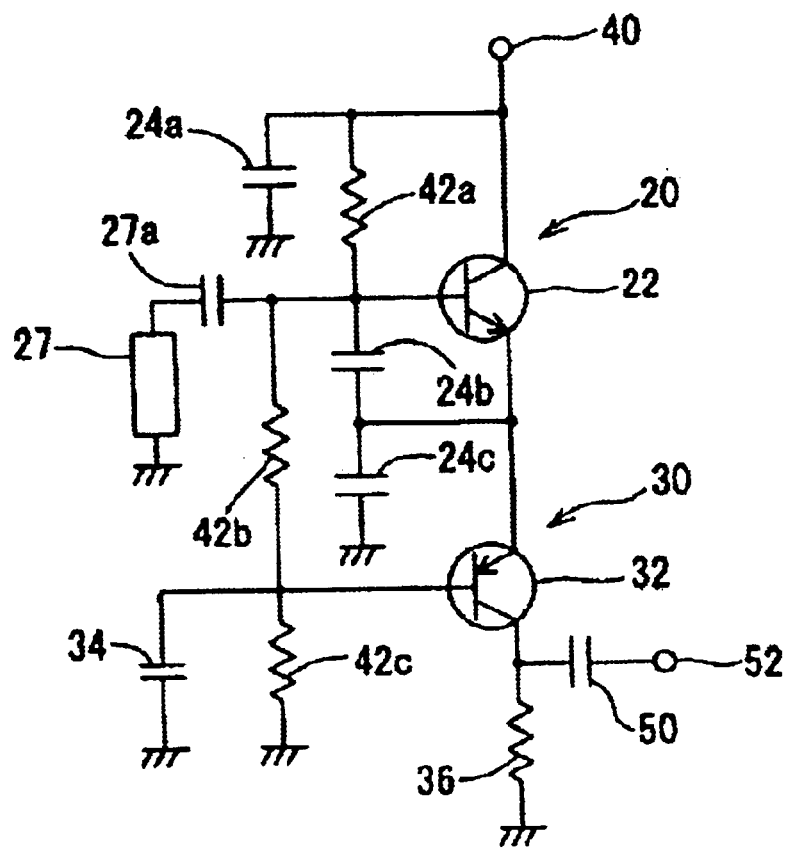
FIG. 5 is a circuit diagram showing another preferred embodiment of the oscillator device according to the present invention.

FIG. 5 is a circuit diagram showing another preferred embodiment of the oscillator device according to the present invention. The oscillator device 10 shown in FIG. 5 differs from the one shown in FIG. 1 in that a stripline resonator 27 is used instead of the crystal oscillator 26. The stripline resonator 27 and a capacitor 27a are connected in series between the base of the transistor 22 and ground. The oscillator device 10 shown in FIG. 5 operates in the same manner and achieves the same advantages as the oscillator device 10 shown in FIG. 1, except that the oscillator device is not a crystal oscillator device.

Figure 6:
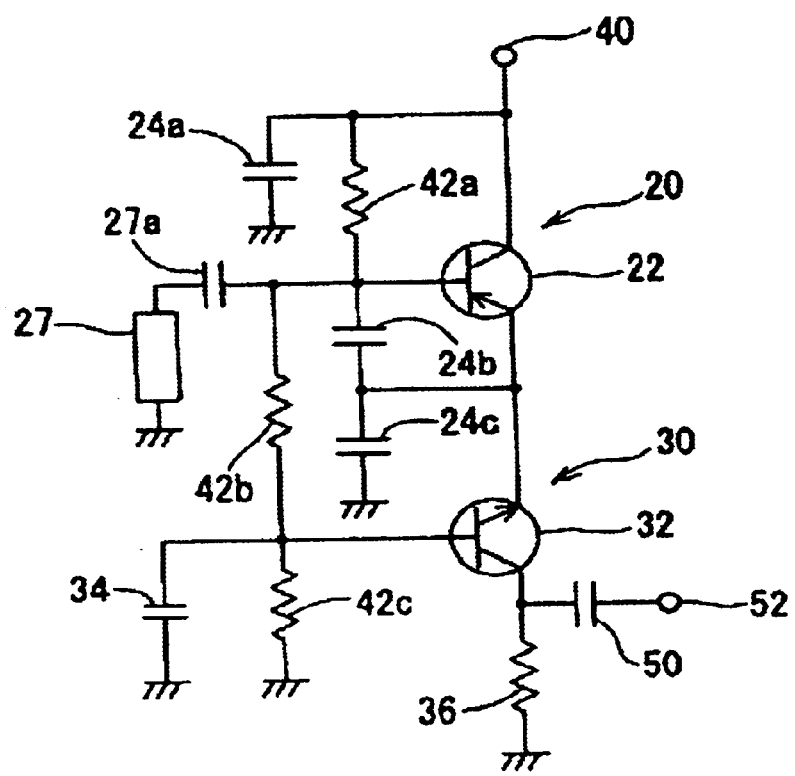
FIG. 6 is a circuit diagram showing another preferred embodiment of the oscillator device according to the present invention.

FIG. 6 is a circuit diagram showing another preferred embodiment of the oscillator device according to the present invention. The oscillator device 10 shown in FIG. 6 differs from the one shown in FIG. 4 in that a stripline resonator 27 is used instead of the crystal oscillator 26. The stripline resonator 27 and a capacitor 27a are connected in series between the base of the transistor 22 and ground. The oscillator device 10 shown in FIG. 6 operates in the same manner and achieves the same advantages as the oscillator device 10 shown in FIG. 4, except that the oscillator device is not a crystal oscillator device.

Incidentally, in each of the above-described oscillator devices 10, the two transistors used as the transistor 22 and the transistor 32 may be integrated in a single package.

Figure 14:
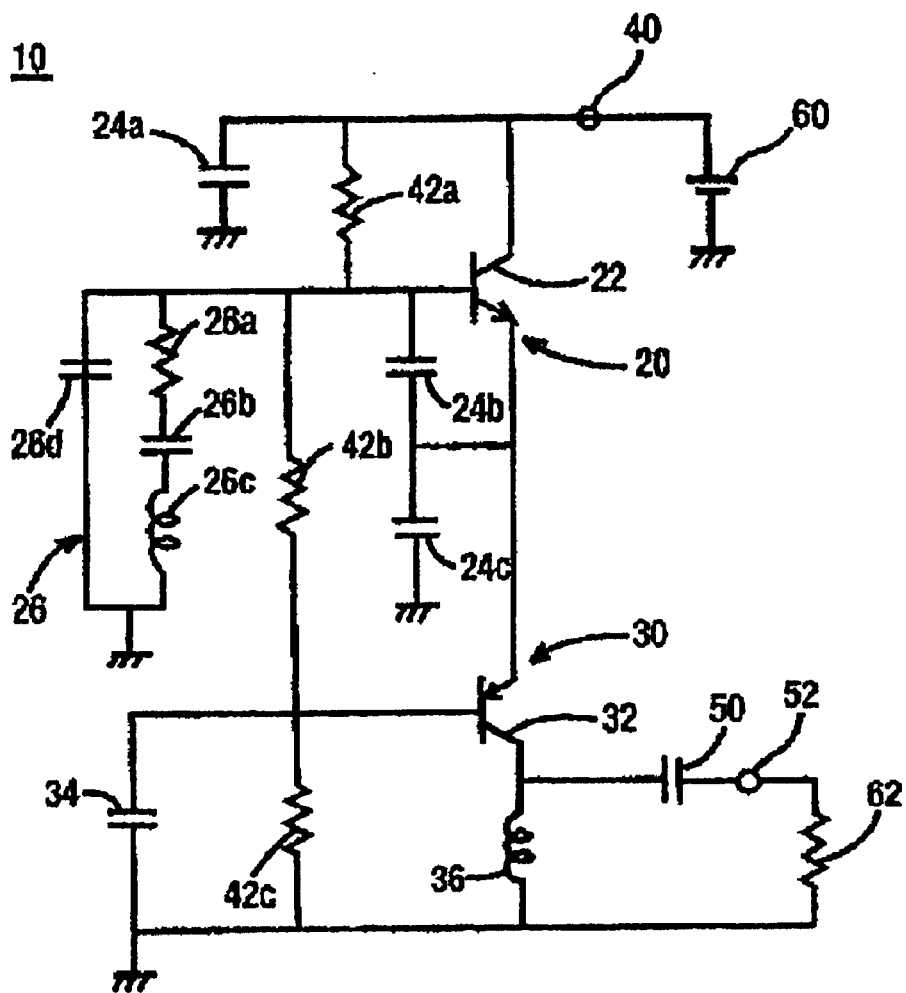
FIG. 14 is a circuit diagram showing a preferred embodiment of an oscillator device according to the present invention.

Also, in each of the above-described oscillator devices 10, between the base of the transistor 22 and ground, a circuit element, such as a variable capacitance element, may be connected in series or in parallel to the crystal oscillator 26 or the stripline resonator 27. By connecting such a circuit element in order to change the circuit constant thereof, the oscillation frequency of the oscillation circuit 20 can be adjusted. For example, when the load is a variable capacitance element, changing the voltage applied to the variable capacitance element, as shown in FIG. 14, results in a change in capacitance of the variable capacitance element, and thus the oscillation frequency of the oscillation circuit 20 is changed.

Figure 13:
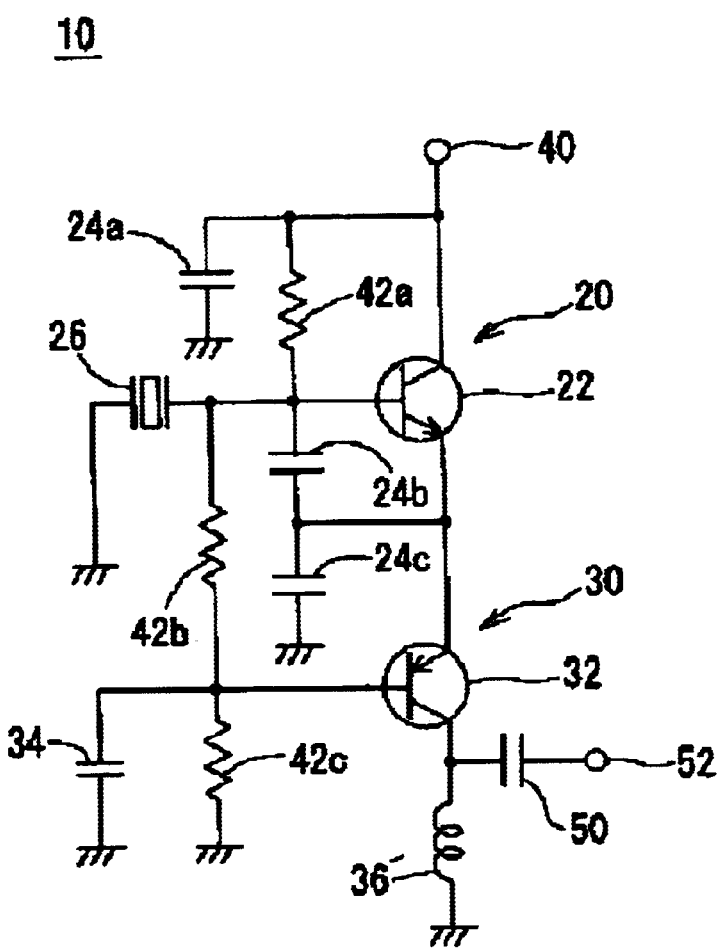
FIG. 13 is a circuit diagram showing a preferred embodiment of an oscillator device according to the present invention.

Further, in each of the above-described oscillator devices 10, an inductor 36', as shown in FIG. 13, that functions as a load may be connected between the collector of the transistor 32 and ground, instead of the resistor 36.

Also, in each of the above-described oscillator devices 10, any one of the resistors 42a, 42b, and 42c may be removed to apply a bias voltage to the base of the transistor 22 and the base of the transistor 32.

Figure 7:
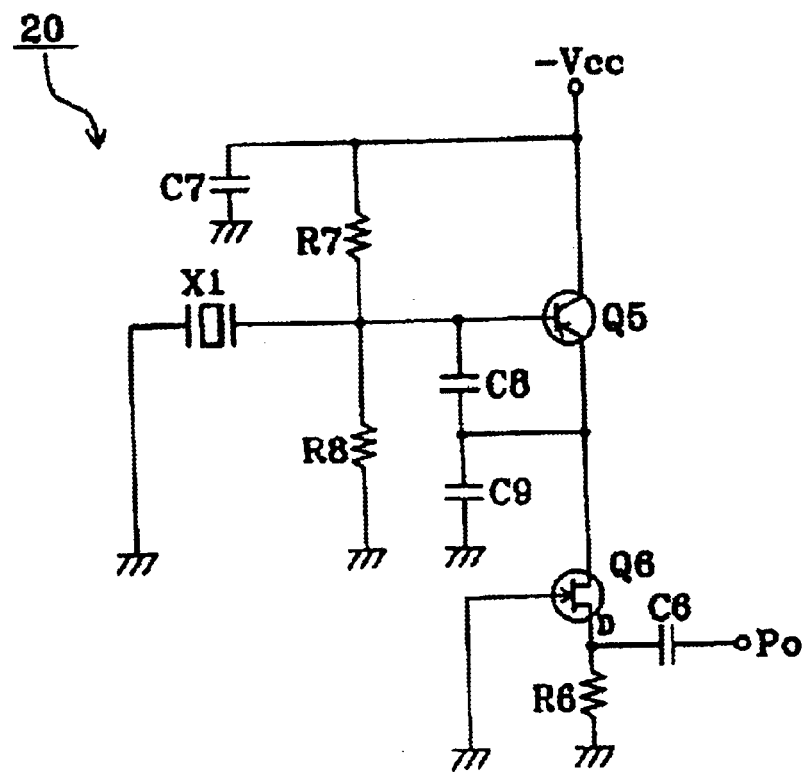
FIG. 7 is a circuit diagram showing another preferred embodiment of the oscillator device according to the present invention.

FIG. 7 shows a circuit diagram of another preferred embodiment of the oscillator device according to the present invention.

In FIG. 7, the oscillator device 10 includes an oscillation NPN bipolar transistor Q3, a buffer-amplifier P-channel junction FET Q4, a crystal oscillator X1, resistors R6 to R8, and capacitors CG to C9. Generally, a bipolar transistor causes less flicker noise than an FET. Thus, a bipolar transistor reduces phase noise of an oscillation signal of an oscillator device and is preferable for an active element for oscillation.

A positive-polarity power supply voltage is applied to a power terminal +VCC. The power terminal +VCC is grounded via the capacitor C7 and is connected to the collector of the transistor Q3. The emitter of the transistor Q3 is grounded via the capacitor C9 and connected to the source of the FET Q4. The gate of the FET Q4 is grounded. The drain of the FET Q4 is connected to an output terminal Po via the capacitor C6 and is grounded via the resistor R6 which functions as a load impedance element. Also, the power terminal +VCC is grounded via the resistors R7 and R8. The node between the resistors R7 and RB is connected to the base of the transistor Q3 and is grounded via the crystal oscillator X1. The capacitor C8 is connected between the base and emitter of the transistor Q3.

The oscillator device 10 includes a Colpitts oscillation circuit. That is, the collector of the transistor Q3 is grounded in a high-frequency state via the capacitor C7, the crystal oscillator X1 is connected between the collector and base, the capacitor C8 is connected between the base and emitter, and the capacitor C9 is connected between the collector and emitter. On the other hand, a buffer amplifier circuit including the FET Q4 defines a buffer amplifier circuit in which the gate is DC-grounded and also high-frequency-grounded. An oscillation signal output from the emitter of the transistor Q3 is input to the source of the FET Q4 and is amplified, and then is output from the drain of the FET Q4 to the output terminal Po via the capacitor C6. The principal current in the oscillator device 10 flows between the collector and emitter of the transistor Q3, between the source and drain of the FET Q4, and through the resistor R6. That is, the transistor Q3 and the FET Q4 are connected in series with respect to the power supply. The resistors R7 and R8 function as bias resistors for applying base current to the transistor Q3.

Now, the buffer amplifier circuit including the FET Q4 is described. The FET Q4 is a P-channel FET. When current flows through the resistor R6, the drain potential of the FET Q4 becomes greater than the gate potential thereof. That is, the gate potential becomes less than the drain potential and the FET Q4 operates by self-biasing.

From the viewpoint of the transistor Q3, the buffer amplifier circuit which operates in the manner described above appears to be a load resistor connected to the emitter. Accordingly, the oscillation circuit including the transistor Q3 is a grounded-collector Colpitts oscillation circuit in which the buffer amplifier circuit functions as a load resistor.

As described above, in the oscillator device 10, the buffer amplifier circuit also functions as a load resistor of the oscillation circuit, and a separate load resistor is not required. Thus, in this case, much less power consumption is required as compared to the known oscillator device 1. Further, the voltage between the collector and emitter of the transistor Q3 and the voltage between the source and drain of the FET Q4 are higher than in the known oscillator device because a separate load resistor is not required. Consequently, the amplification factor and the power efficiency are greatly improved. In addition, the oscillator device 10 has fewer components than the known oscillator device 1. That is, the number of resistors is 2 less and the number of capacitors is 1 less than the conventional device. Accordingly, the number of components is reduced and the size of the oscillator device of preferred embodiments of the present invention is reduced.

In the oscillator device 10, the drain of the FET Q4 is grounded via the resistor R6 that functions as a load impedance element. However, a radio frequency choke (RFC) coil may also be used as the load impedance element. In that case, however, the drain potential of the FET Q4 becomes 0 V for DC-voltage, that is, the same as the gate potential. Thus, a normally-on FET, such as a depletion FET, in which an adequate amount of current flows even if the voltage between the drain and gate is 0 V and preferable transconductance is obtained, is used as the FET Q4.

Figure 8:
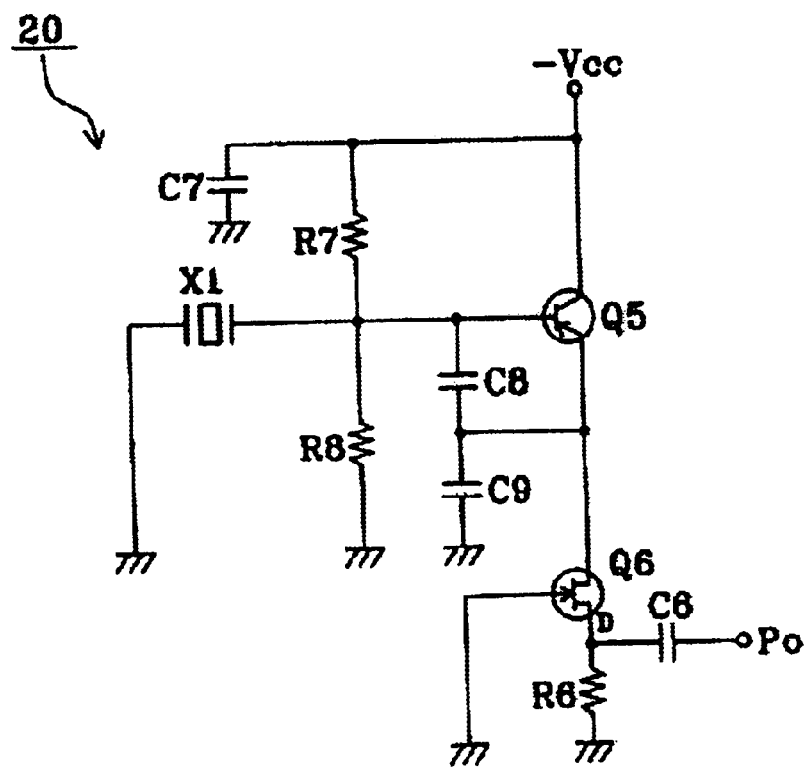
FIG. 8 is a circuit diagram showing another preferred embodiment of the oscillator device according to the present invention.

FIG. 8 is a circuit diagram of another preferred embodiment of the oscillator device according to the present invention. In FIG. 8, like reference numerals depict the identical or equivalent components to those in FIG. 7 and the corresponding description is omitted.

In FIG. 8, an oscillator device 20 includes a PNP bipolar transistor Q5 instead of the transistor Q3 in the oscillator device 10 and an N-channel junction FET Q6 instead of the FET Q4 in the oscillator device 10. The transistor Q5 and the FET Q6 are connected to other components in the same manner as in the oscillator device 10. Further, a negative-polarity power supply voltage is applied to a power terminal −Vcc.

In the oscillator device 20, the polarity of the channel is reversed in the transistor for the oscillation circuit and the FET for the buffer amplifier circuit compared with the oscillator device 10, and accordingly the polarity of the power supply is reversed. Therefore, the oscillator device 20 has substantially the same operation and advantages as those of the oscillator device 10.

Figure 9:
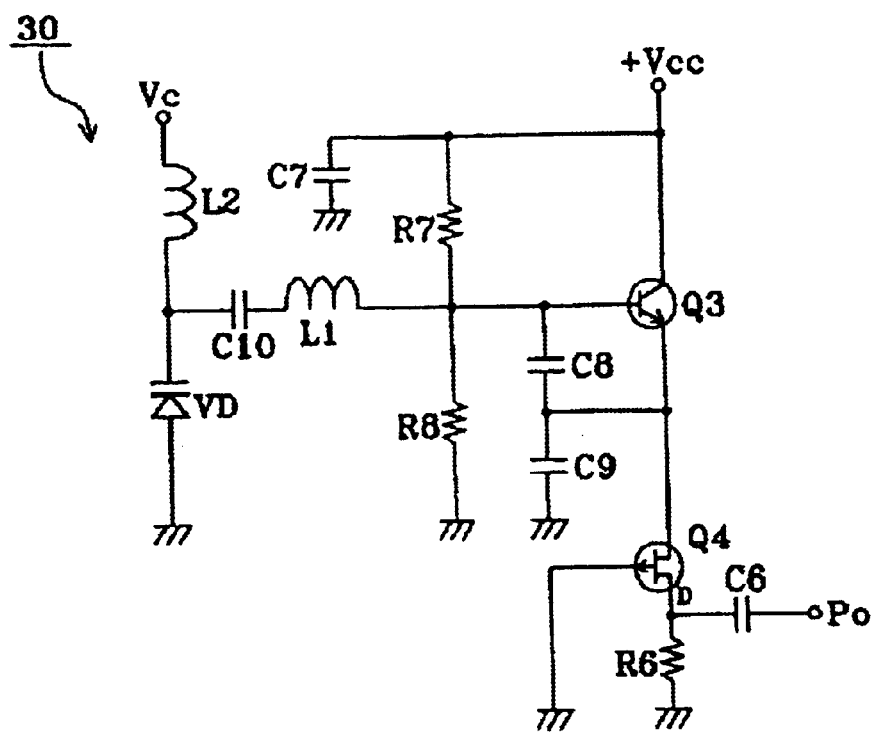
FIG. 9 is a circuit diagram showing another preferred embodiment of the oscillator device according to the present invention.

FIG. 9 is a circuit diagram of another preferred embodiment of the oscillator device according to the present invention. In FIG. 9, like reference numerals depict the identical or equivalent components to those in FIG. 7 and the corresponding description is omitted.

In FIG. 9, an oscillator device 30 includes a capacitor C10, an inductance element L1, an RFC coil L2, and a varactor diode VD instead of the crystal oscillator X1 in the oscillator device 10 in FIG. 7. One end of the inductance element L1 is connected to the node between the resistors R7 and R8, that is, the base of the transistor Q3. The other end of the inductance element L1 is connected via the capacitor C10 to the node between the cathode of the varactor diode VD and one end of the RFC coil L2. The anode of the varactor diode VD is grounded. The other end of the RFC coil L2 is connected to a control terminal Vc. The capacitor C10 is a DC-cutting capacitor. Accordingly, a DC control voltage input from the control terminal Vc is not applied to the base of the transistor Q3.

In the oscillator device 30, the inductance element L1 and the varactor diode VD define the resonance circuit of the oscillation circuit. By changing a DC voltage applied from the control terminal Vc to the cathode of the varactor diode VD, the capacitance of the varactor diode VD is changed. Consequently, the resonance frequency of the resonance circuit is changed and eventually the oscillation frequency of the oscillator device 30 is changed. The oscillator device 30 is a voltage-controlled oscillator device.

The oscillator device 30 differs from the oscillation circuit 10 only in the configuration of the resonance circuit and the basic configuration as the oscillator device is the same as that of the oscillator device 10. Thus, the oscillator devices 10 and 30 have the same operation and advantages.

Figure 10:
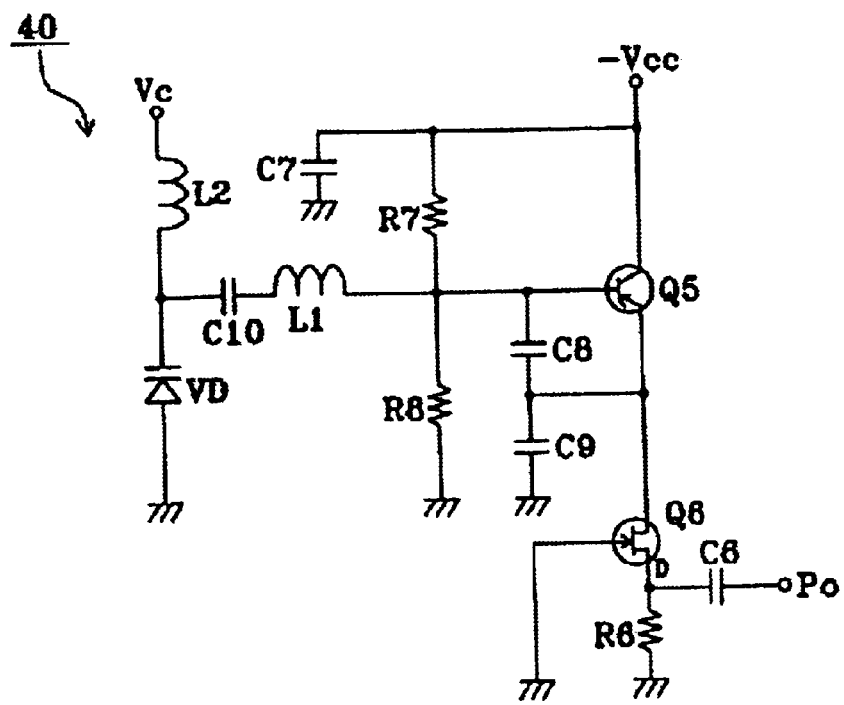
FIG. 10 is a circuit diagram showing another preferred embodiment of the oscillator device according to the present invention.

FIG. 10 is a circuit diagram of another preferred embodiment of the oscillator device according to the present invention. In FIG. 10, like reference numerals depict the identical or equivalent components to those in FIGS. 8 and 9 and the corresponding description is omitted.

In FIG. 10, an oscillator device 40 includes the capacitor C10, the inductance element L1, the RFC coil L2, and the varactor diode VD as in the oscillator device 30 in FIG. 9, instead of the crystal oscillator X1 in the oscillator device 20 in FIG. 8. That is, the oscillator device 40 is constructed by modifying the oscillator device 20 so as to provide a voltage-controlled oscillator device which is the same as the oscillator device 30.

The oscillator device 40 differs from the oscillation circuit 20 only in the configuration of the resonance circuit and the basic configuration as an oscillator device is preferably the same as that of the oscillator device 20. Thus, the oscillator devices 20 and 40 have the same operation and advantages.

In each of the above-described preferred embodiments, a junction FET is preferably used as the FET. However, the type of the FET is not limited to a junction type and a MOS-FET and a MES-FET may also be used.

Further, the drain and the source are arranged symmetrically relative to the gate in the FET and may be inverted. The same operation and advantages can be achieved in both cases.

Figure 11:
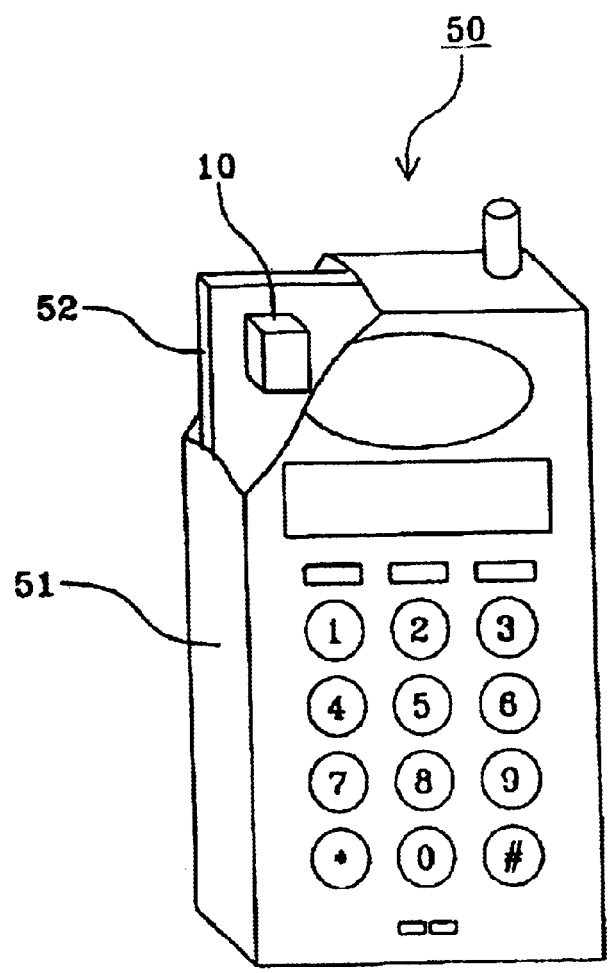
FIG. 11 is a perspective view showing a preferred embodiment of an electronic apparatus according to the present invention.

FIG. 11 is a perspective view showing a preferred embodiment of an electronic apparatus according to the present invention. In FIG. 11, a cellular phone 50 as an example of an electronic apparatus includes a casing 51, a printed circuit board 52 provided therein, and for example, the oscillator device 10 according to one of the preferred embodiments of the present invention mounted on the printed circuit board 52. The cellular phone 50 may include the oscillator device according to any of the other preferred embodiments.

In the cellular phone 50, increased efficiency, low cost, and miniaturization are achieved because the oscillator device 10 according to any of the preferred embodiments of the present invention is used.

In FIG. 11, a cellular phone is shown as an electronic apparatus. However, other suitable electronic apparatuses can use the oscillator device of preferred embodiments of the present invention.

It should be understood that the foregoing description is only illustrative of the present invention. Various alternatives and modifications can be devised by those skilled in the art without departing from the invention. Accordingly, the present invention is intended to embrace all such alternatives, modifications and variations which fall within the scope of the appended claims.

What is claimed is:

1. An oscillator device comprising:
an oscillation circuit including an NPN oscillation transistor and a buffer amplifier circuit including a PNP buffer amplifier transistor; wherein
the NPN oscillation transistor and the PNP buffer amplifier transistor are connected in series to a power supply;
a collector of the NPN oscillation transistor is connected to a power terminal and is grounded via a capacitor;
a base of the PNP buffer amplifier transistor is grounded via a capacitor;
at least one of a resistor and an inductor is connected between a collector of the PNP buffer amplifier transistor and the ground;
the collector of the PNP buffer amplifier transistor is AC-connected to an output terminal; and
an emitter of the NPN oscillation transistor and an emitter of the PNP buffer amplifier transistor are directly connected.

2. The oscillator device according to claim 1, further comprising at least two resistors connected at at least two positions respectively selected from between the power terminal and a base of the NPN oscillation transistor, between the base of the NPN oscillation transistor and a base of the PNP buffer amplifier transistor, and between the base of the PNP buffer amplifier transistor and a ground, such that individual bias voltages are applied to the base of the NPN oscillation transistor and the base of the PNP buffer amplifier transistor.

3. The oscillator device according to claim 1, wherein the oscillation circuit comprises a crystal oscillator connected between a base of the NPN oscillation transistor and a ground, and a capacitance element connected to the crystal oscillator, and the oscillation frequency varies by changing the value of the capacitance element.

4. The oscillator device according to claim 3, wherein the oscillator device is a temperature-compensated crystal oscillator device.

5. The oscillator device according to claim 1, wherein the NPN oscillation transistor and the PNP buffer amplifier transistor are integrated in a single package.

6. An electronic apparatus comprising the oscillator device according to claim 1.

7. An oscillator device comprising:
an oscillation circuit including a PNP oscillation transistor and a buffer amplifier circuit including an NPN buffer amplifier transistor; wherein
the PNP oscillation transistor and the NPN buffer amplifier transistor are connected in series to a power supply;
a collector of the PNP oscillation transistor is connected to a power terminal and is grounded via a capacitor;
a base of the NPN buffer amplifier transistor is grounded via a capacitor;
at least one of a resistor and an inductor is connected between a collector of the NPN buffer amplifier transistor and the ground;
the collector of the NPN buffer amplifier transistor is AC-connected to an output terminal; and
an emitter of the PNP oscillation transistor and an emitter of the NPN buffer amplifier transistor are directly connected.

8. The oscillator device according to claim 7, further comprising at least two resistors connected at at least two positions respectively selected from between the power terminal and a base of the PNP oscillation transistor, between a base of the PNP oscillation transistor and a base of the NPN buffer amplifier transistor, and between the base of the NPN buffer amplifier transistor and a ground, such that individual bias voltages are applied to the base of the PNP oscillation transistor and the base of the NPN buffer amplifier transistor.

9. The oscillator device according to claim 7, wherein the oscillation circuit comprises a crystal oscillator connected between a base of the PNP oscillation transistor and a ground, and a capacitance element connected to the crystal oscillator, and the oscillation frequency varies by changing the value of the capacitance element.

10. The oscillator device according to claim 9, wherein the oscillator device is a temperature-compensated crystal oscillator device.

11. The oscillator device according to claim 7, wherein the PNP oscillation transistor and the NPN buffer amplifier transistor are integrated in a single package.

12. An electronic apparatus comprising the oscillator device according to claim 7.

* * * * *